(12) United States Patent
Bang et al.

(10) Patent No.: US 8,432,334 B2
(45) Date of Patent: Apr. 30, 2013

(54) ORGANIC LIGHT EMITTING DISPLAY DEVICE

(75) Inventors: Hyun-Chol Bang, Yongin (KR); Won-Kyu Kwak, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 154 days.

(21) Appl. No.: 12/805,645

(22) Filed: Aug. 11, 2010

(65) Prior Publication Data

US 2011/0043495 A1 Feb. 24, 2011

(30) Foreign Application Priority Data

Aug. 20, 2009 (KR) .................. 10-2009-0077045

(51) Int. Cl.
*G09G 3/30* (2006.01)
(52) U.S. Cl.
USPC ............. 345/76; 315/73; 257/295; 313/506; 313/509; 313/512; 313/498; 313/582; 345/45
(58) Field of Classification Search .................. None
See application file for complete search history.

(56) References Cited

U.S. PATENT DOCUMENTS

| | | | | |
|---|---|---|---|---|
| 5,596,023 | A * | 1/1997 | Tsubota et al. | 522/100 |
| 6,624,572 | B1 * | 9/2003 | Kim et al. | 313/512 |
| 6,861,801 | B2 * | 3/2005 | Kim et al. | 313/512 |
| 7,196,465 | B2 | 3/2007 | Park et al. | |
| 7,796,231 | B2 * | 9/2010 | Nakayoshi et al. | 349/153 |
| 7,958,656 | B2 * | 6/2011 | Soderberg et al. | 37/228 |
| 2004/0232459 | A1 * | 11/2004 | Takayama et al. | 257/295 |
| 2005/0057151 | A1 * | 3/2005 | Kuwabara | 313/506 |
| 2005/0184927 | A1 * | 8/2005 | Kwak | 345/45 |
| 2007/0170859 | A1 | 7/2007 | Choi et al. | |
| 2008/0197778 | A1 * | 8/2008 | Kubota | 315/73 |
| 2009/0179566 | A1 * | 7/2009 | Imamura | 313/512 |
| 2009/0201273 | A1 * | 8/2009 | Sato et al. | 345/206 |

FOREIGN PATENT DOCUMENTS

| | | |
|---|---|---|
| JP | 2005-352498 A | 12/2005 |
| JP | 2008-216975 A | 9/2008 |
| JP | 2009-027123 A | 2/2009 |
| KR | 10 2003-0086333 A | 11/2003 |
| KR | 10-2005-0068864 A | 7/2005 |
| KR | 10 2005-00822 A | 8/2005 |
| KR | 10 2005-0113517 A | 12/2005 |
| KR | 10-2006-0065370 A | 6/2006 |
| KR | 10-0732811 B1 | 6/2007 |

OTHER PUBLICATIONS

Extended European Search Report in EP 10173493.7-1235, dated Dec. 16, 2010 (Bang, et al.).

* cited by examiner

*Primary Examiner* — Kent Chang
*Assistant Examiner* — Benjamin Morales Fernandez
(74) *Attorney, Agent, or Firm* — Lee & Morse, P.C.

(57) ABSTRACT

An organic light emitting display device, comprises a pixel unit including a plurality of pixels, each of the pixels including an organic light emitting diode having a first electrode, a second electrode, and an organic light emitting layer; a built-in-circuit comprising a driving circuit configured to drive the pixels; and a bus unit comprising bus lines configured to deliver pixel power to the pixels. The pixel unit, the built-in-circuit, and the bus unit are sequentially disposed from a central region of a display panel to an outer side of the display panel. The second electrode of the organic light emitting diode and one of the bus lines are electrically connected to each other through one of conductive patterns formed on at least a part of the built-in-circuit and at least a part of the bus unit.

16 Claims, 3 Drawing Sheets

ORGANIC LIGHT EMITTING DISPLAY DEVICE

BACKGROUND

1. Field

The embodiments relates to an organic light emitting display device, and more particularly, to an organic light emitting display device capable of reducing dead space and preventing voltage drop of pixel power to be supplied to pixels.

2. Description of the Related Art

Recently, various flat panel display devices having a smaller volume of a light source than a cathode ray tube have been developed.

Particularly, among the flat panel display devices, an organic light emitting display device displays an image by using organic light emitting diodes as emission devices. An organic light emitting display device attracts attention as a next generation of a display device because of its excellent brightness and color purity.

An organic light emitting diode includes an anode electrode and a cathode electrode that face each other and an organic light emitting layer disposed therebetween. During emission of the organic light emitting diode, the anode electrode is connected to high potential pixel power, and the cathode electrode is connected to low potential pixel power. Holes and electrons are injected into the organic light emitting layer from the anode electrode and the cathode electrode, respectively. The electrons are inserted into the holes in the organic light emitting layer to excite molecules. The excited molecules return to the ground state while emitting energy, and the organic light emitting diode emits light.

In a general organic light emitting display device, an anode electrode and an cathode electrode of the organic light emitting diode may be formed on a whole pixel unit.

When the anode electrode is connected to high potential pixel power via a pixel circuit, and the cathode electrode is connected directly to low potential pixel power without passing through a pixel circuit, the cathode electrode may be formed on a whole pixel unit. The cathode electrode is connected to connection wirings such as bus lines of the low potential pixel power around the pixel unit, and is supplied with the low potential pixel power.

In order to reduce dead space, a cathode contact region and a bus region in which the cathode electrode and the bus lines of the low potential pixel power are connected to the low potential pixel power may be reduced. However, brightness may not be uniform due to IR drop of the low potential pixel power.

Therefore, it is demanded that a limited design space be effectively utilized to reduce dead space and IR drop of the low potential pixel power to be supplied to the pixels be prevented.

SUMMARY

Embodiments are therefore directed to an organic light emitting display, which substantially overcome one or more of the problems due to the limitations and disadvantages of the related art.

It is therefore a feature of an embodiment to provide an organic light emitting display device, comprising: a pixel unit comprising a plurality of pixels, each of the pixels including an organic light emitting diode having a first electrode, a second electrode, and an organic light emitting layer; a built-in-circuit comprising a driving circuit configured to drive the pixels; and a bus unit comprising bus lines configured to deliver pixel power to the pixels, wherein the pixel unit, the built-in-circuit, and the bus unit are sequentially disposed from a central region of a display panel to an outer side of the display panel, and wherein the second electrode of the organic light emitting diode and one of the bus lines are electrically connected to each other through one of conductive patterns formed on at least a part of the built-in-circuit and at least a part of the bus unit.

At least a part of the second electrode of the organic light emitting diode may be formed on each entire pixel in the pixel unit.

The second electrode of the organic light emitting diode may be a cathode electrode, and each of the bus lines may deliver low potential pixel power to the cathode electrode.

The conductive patterns may be formed on the same layer as the first electrode of the organic light emitting diode, and may be made of the same material as the first electrode of the organic light emitting diode.

The first electrode of the organic light emitting diode may be an anode electrode, and the conductive patterns may be made of the same material as the anode electrode.

The second electrode of the organic light emitting diode may be connected to one of the conductive patterns on the built-in-circuit, and the bus lines may be connected to the conductive patterns on the bus unit.

Each of the pixels may further include a first thin film transistor electrically connected to the organic light emitting diode, wherein the bus lines may be formed on the same layer as any one of a gate electrode, source electrode, and drain electrode of the first thin film transistor, and may be made of the same material as any one of the gate electrode, the source electrode and the drain electrode of the first thin film transistor.

The built-in-circuit may further comprise a second thin film transistor electrically connected to the organic light emitting diode, and the bus lines may be formed on the same layer as the source and drain electrodes of the second thin film transistor, and made of the same material as the source and drain electrodes of the second thin film transistor.

The organic light emitting display device may further comprise: cathode contacts, each of the cathode contacts including a contact region in which one of the conductive patterns is connected to the second electrode of the organic light emitting diode, wherein the cathode contacts are disposed so as to overlap the built-in-circuit.

The organic light emitting display device may further comprise a sealing unit, the sealing unit including a sealing agent configured to seal a region including the pixel unit, wherein the sealing unit is disposed so as to partially overlap the bus unit.

The built-in-circuit may include either of a scan driving unit and a light emitting control driving unit, or both of the scan driving unit and the light emitting control driving unit.

The built-in-circuit may be formed on both sides of the pixel unit, and both sides of the pixel unit face each other.

According to the embodiments, since the built-in-circuit is positioned inside the bus unit, the built-in-circuit may be prevented from being damaged by static electricity.

In addition, since the bus unit and the sealing unit overlap each other, dead space is reduced and a sufficient width of the bus lines is secured. Accordingly, IR drop of the low potential pixel power supplied through the bus lines may be prevented.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
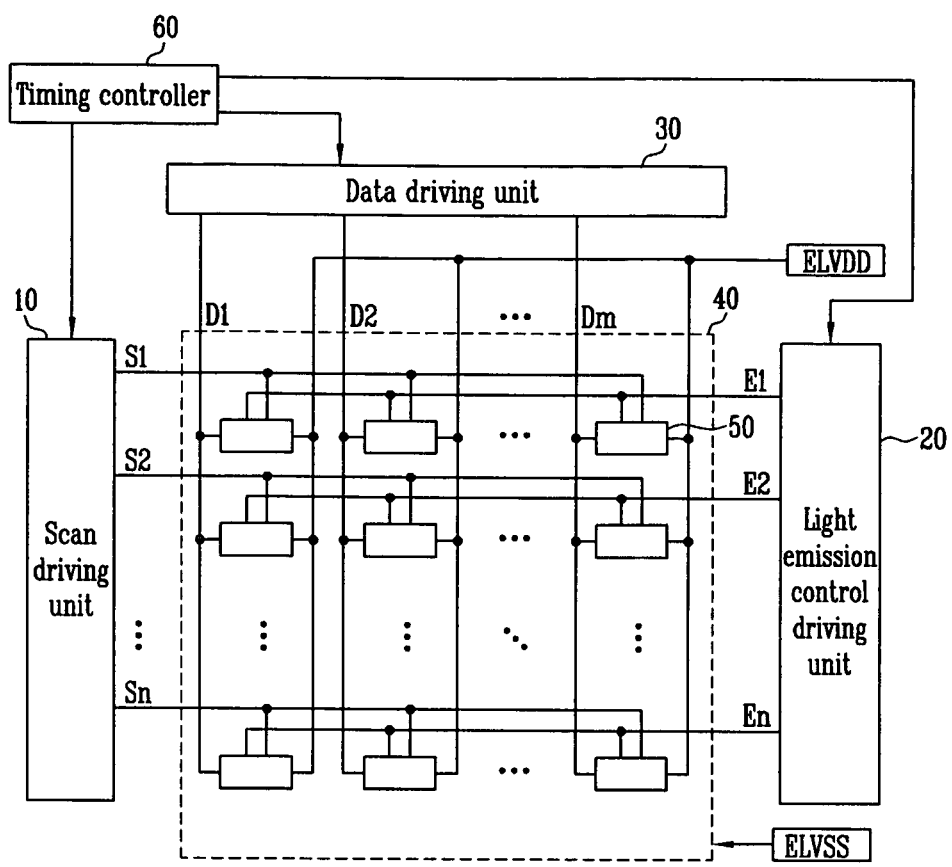
FIG. 1 is a block diagram illustrating an exemplary organic light emitting display device.

Korean Patent Application No. 10-2009-0077045, filed on Aug. 20, 2009, in the Korean Intellectual Property Office, and entitled: "Organic Light Display Device" is incorporated by reference herein in its entirety.

In the following detailed description, only certain exemplary embodiments have been shown and described, simply by way of illustration. In the drawing figures, the dimensions of layers and regions may be exaggerated for clarity of illustration. As those skilled in the art would realize, the described embodiments may be modified in various different ways. Accordingly, the drawings and description are to be regarded as illustrative in nature and not restrictive. In addition, when an element is referred to as being "on" another element, it can be directly on another element or be indirectly on another element with one or more intervening elements interposed therebetween. It will also be understood that when a layer is referred to as being "between" two layers, it can be the only layer between the two layers, or one or more intervening layers may also be present. Also, when an element is referred to as being "connected to" another element, it can be directly connected to another element or be indirectly connected to another element with one or more intervening elements interposed therebetween. Hereinafter, like reference numerals refer to like elements.

Hereinafter, the embodiments will be described such that those skilled in the art can easily practice the embodiments in detail with reference to the accompanying drawings.

FIG. 1 is a block diagram illustrating an exemplary organic light emitting display device.

Referring to FIG. 1, the organic light emitting display device may include a scan driving unit 10, a light emission control driving unit 20, a data driving unit 30, a pixel unit 40, and a timing controller 60.

The scan driving unit 10 may be controlled by the timing controller 60, and sequentially supply scan signals to scan lines S1 to Sn. Pixels 50 may be selected by the scan signals, and sequentially receive data signals.

The light emission control driving unit 20 may be controlled by the timing controller 60, and sequentially supply light control signals to light emission control lines E1 to En. The pixels 50 may be controlled by the light emission control signals, and emit light.

The scan driving unit 10 and the light emission control driving unit 20 may be mounted in the form of a chip to form a build-in-circuit. Alternatively, the scan driving unit 10 and the light emission control driving unit 20 may be mounted on a display panel together with driving devices included in the pixel unit 40 to form a built-in-circuit.

Alternatively, the scan driving unit 10 and the light emission control driving unit 20 may be formed on the surfaces facing each other while the pixel unit 40 is interposed therebetween. Arrangement of the scan driving unit 10 and the light emission control driving unit 20 is not limited to this arrangement.

For example, the scan driving unit 10 and the light emission control driving unit 20 may be formed on the same surface of the pixel unit 40. Alternatively, the scan driving unit 10 and the light emission control driving unit 20 may be formed on both surfaces of the pixel unit 40, respectively.

In addition, the light emission control driving unit 20 may be omitted according to the configuration of the pixels 50 that are provided in the pixel unit 40.

The pixel unit 40 may include a plurality of pixels 50. The pixels may be positioned at intersecting positions of scan lines S1 to Sn, light emission control lines E1 to En, and data lines D1 to Dm. The data driving unit 30 may be controlled by the timing controller 60, and supply data signals to the data lines D1 to Dm. The data signals supplied to the data lines D1 to Dm may be supplied to pixels 50 that are selected by the scan signals whenever the scan signal are supplied. The selected pixels 50 charge voltages corresponding to the data signals.

The above-mentioned pixel unit 40 may be supplied with high potential pixel power ELVDD and low potential pixel power ELVSS from the outside. The pixel unit 40 may transfer the high potential pixel power ELVDD and the low potential pixel power ELVSS to the respective pixels 50. The respective pixels 50 may emit light at brightness corresponding to the data signal to display an image.

Each of the pixels 50 may include an organic light emitting diode (not shown) having a first electrode and a second electrode. The high potential pixel power ELVDD may be transferred to a first electrode (for example, an anode electrode) of an organic light emitting diode in a selected pixel 50 for an emission period of the selected pixel 50. The low potential pixel power ELVSS may be transferred to a second electrode (for example, a cathode electrode) of the organic light emitting diode.

At this time, the whole first electrodes of the organic light emitting diodes may be formed on the pixel unit 40. The second electrodes of the organic light emitting diodes may be formed on the whole pixel unit 40.

Particularly, when the first electrodes of the organic light emitting diodes are connected to the high potential pixel power ELVDD via the pixel circuits and the second electrodes of the organic light emitting diodes are directly connected to the low potential pixel power ELVSS without passing through the pixel circuits, the second electrode of the organic light emitting diode may be formed on the whole pixel unit 40.

The above-mentioned second electrodes may be supplied with the low potential pixel power ELVSS through wirings such as bus lines (not shown) formed around the pixel unit 40.

The first electrodes of the organic light emitting diodes may be patterned so as to correspond to a pixel array within the pixel unit 40.

The timing controller 60 may generate control signals in response to a synchronizing signal supplied from the outside. The generated control signals may be transmitted to the scan driving unit 10, the light emission control driving unit 20, and the data driving unit 30. By such operations, the timing controller 60 may control the scan driving unit 10, the light emission control driving unit 20, and the data driving unit 30. In addition, the timing controller 60 may deliver data fed from the outside to the data driving unit 30. The data driving unit 30 may generate data signals corresponding to the data.

Figure 2:
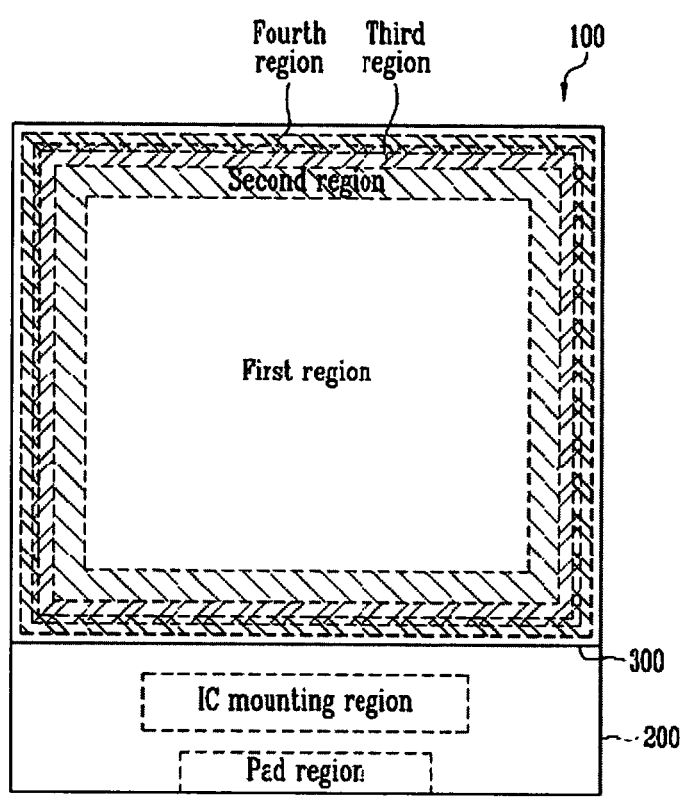
FIG. 2 is a plan view illustrating an organic light emitting display device according to an embodiment.

FIG. 2 is a plan view illustrating an organic light emitting display device according to an embodiment.

Referring to FIG. 2, the organic light emitting display device according to embodiments may be divided into first, second, third, and fourth regions, an IC mounting region, and a pad region. Those regions are sequentially arranged from the central region to the outer side regions.

The first region may be a pixel unit region in which a plurality of pixels are formed. The first region may occupy the largest central region in comparison to the other regions. Each of the pixels in an organic light emitting display such as an active matrix organic light emitting display may include an organic light emitting diode having a first electrode, a second electrode, and an organic light emitting layer. Each of the pixels may further include thin film transistor electrically connected to the organic light emitting diode.

The second region may be a region in which a built-in-circuit and cathode contacts are formed. The built-in-circuit may include a driving circuit configured to drive the pixels is formed. In each cathode contact, a conductive pattern configured to connect the second electrode of each organic light emitting diode to a bus line of the low potential pixel power ELVSS is formed. The second region may be arranged at the outside of the first region.

Here, the built-in-circuit and the cathode contacts included in the second region may overlap each other. The details of their structures are described below.

The driving circuits configured to drive the pixels may include the scan driving unit and/or the light emission control driving unit. The built-in circuit may further include a testing circuit as demanded.

The built-in-circuit may be disposed at least at a side of the first region, for example, a left side, a right side, or both of the left and right sides of the first region. Alternatively, the built-in-circuit may be disposed on the first region in addition to the right and left sides when the testing circuit is included in the built-in-circuit.

The above-mentioned cathode contacts may be formed at least at a side of the first region, for example, at an upper side, a lower side, or both of the upper and lower sides of the first region so as to surround the first region.

The third region may be a region in which a bus unit is formed. The bus unit may include bus lines configured to transfer the low potential pixel power ELVSS to the pixels in the first region. The third region may be disposed outside the second region. For example, the third region may be disposed at an upper side, a lower side, or both of the upper and lower sides of the second region so as to surround the second region.

The fourth region may be a sealing region in which a sealing agent configured to seal a region including the first region is formed. The fourth region may be formed so as to surround the outside of the third region. The sealing agent may bond a first substrate 200 (a deposit substrate) and a second substrate 300 (an encapsulation substrate). The sealing agent may partially overlap the bus lines formed in the third region. That is, the sealing unit may partially overlap the bus unit.

The IC mounting region may be a region in which an IC chip including the data driving unit is mounted. The IC chip may be disposed at a non-encapsulated side of the first substrate 200 (for example, at a lower side).

The pad region may be a region in which a plurality of pads configured to receive driving power and driving signals from the outside are formed. The pads may be disposed at an edge portion of a side of the first substrate 200 (for example, at the lower edge) near the IC mounting region.

According to the above-mentioned embodiments, a limited design space in the display panel 100 is effectively utilized to reduce dead space and to prevent IR drop of the low potential pixel power ELVSS that is supplied to the pixels. The details are described below with reference to FIG. 3.

Figure 3:
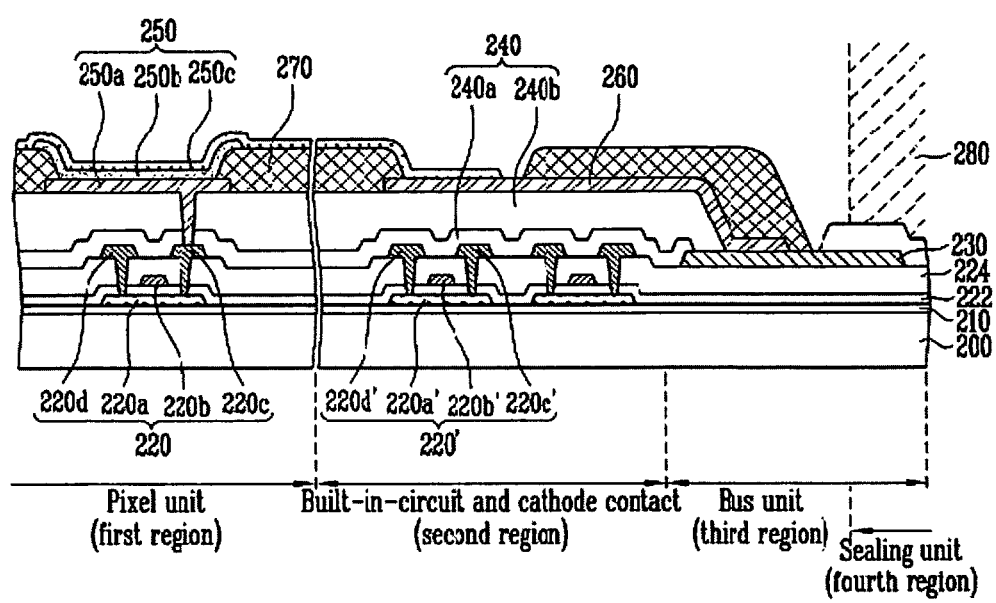
FIG. 3 is a sectional view illustrating a main part of the organic light emitting display device according to the embodiment.

FIG. 3 is a sectional view illustrating a main part of the organic light emitting display device according to the embodiment. For convenience, elements to which are not referred to describe the embodiments are omitted in FIG. 3.

Referring to FIG. 3, a region on the first substrate 200 may be divided into the pixel unit (the first region), the built-in-circuit unit and the cathode contact (the second region), the bus unit (the third region), and the sealing unit (the fourth region).

The pixel unit may include a thin film transistor 220 formed on a buffer layer 210 on the first substrate 200 and an organic light emitting diode 250 formed on the thin film transistor 220.

The thin film transistor 220 may include a semiconductor layer 220a formed on the buffer layer 210, a gate electrode 220b formed on the semiconductor layer 220a, and source and drain electrodes 220c and 220d formed on the gate electrode 220b. A gate insulating layer 222 may be interposed between the gate electrode 220b and the semiconductor layer 220a. An inter layer dielectric layer 224 may be interposed between the source and drain electrodes 220c and 220d and gate electrode 220b. The source and drain electrodes 220c and 220d may be connected to the semiconductor layer 220a through contact holes, respectively.

On the thin film transistor 220, an overcoat 240 may be formed. As described below, the overcoat 240 may have a multiple layer structure including organic/inorganic layers. For example, the overcoat 240 may include a first overcoat 240a as an inorganic dielectric layer and a second overcoat 240b as an organic dielectric layer.

An organic light emitting diode 250 electrically connected to the thin film transistor 220 through a via hole formed in the overcoat 240 is disposed on the overcoat 240 in the pixel unit.

The organic light emitting diode 250 may include a first electrode 250a electrically connected to one of the source and drain electrodes 220c and 220d of the thin film transistor 220, an organic light emitting layer 250b formed on the first electrode 250a, and a second electrode 250c formed on the organic light emitting layer 250b.

Here, the first electrode 250a of the organic light emitting diode 250 may be patterned in the pixel unit. A pixel defined layer 270 may be formed between first electrodes of the pixels. The pixel defined layer 270 may overlap an upper side of an edge region of the first electrode 250a so as to expose the first electrode 250a in a light emitting region of the pixel.

The organic light emitting layer 250b may be formed in a region including the exposed region of the first electrode 250a.

While the second electrode 250c of the organic light emitting diode 250 may be patterned beyond the pixel unit, at least a part of the second electrode 250c may be formed on the whole pixel unit. The second electrode 250c may be connected to the conductive patterns 260 at the cathode contacts. The conductive patterns 260 may be connected to the bus lines 230 of the low potential pixel power in the bus unit.

The second electrodes 250c of the organic light emitting diodes are cathode electrodes throughout the description of the embodiments for the convenience. However, the second electrodes 250c are not limited to be cathode electrodes. For example, by modifying the thin film transistors 220 or the pixel circuits, the second electrodes 250c may be changed into anode electrodes.

The built-in-circuit may be a region in which a driving circuit configured to drive the pixels is formed. The built-in-circuit may include circuit elements such as thin film transistors 220'. Here, since the thin film transistors 220' formed in the built-in-circuit are identical to the thin film transistor 220 formed in the pixel unit in view of structure (but, connection with other elements is not considered), the redundant description of the thin film transistor 220' is omitted.

On the built-in-circuit, the cathode contacts including the conductive patterns 260 may be formed. That is, in the embodiments, the cathode contacts may be overlapped with the built-in-circuit.

The conductive patterns 260 may electrically connect the second electrodes 250c of the organic light emitting diodes to the bus lines 230 of the low potential pixel power. The conductive patterns may be formed on the same layer and made of the same material as the first electrodes 250a of the organic light emitting diodes. For example, the conductive patterns 260 may be formed on the overcoat 240, and made of the same material as the anode electrodes.

Each cathode contact may include a contact region in which the conductive pattern 260 contacts a second electrode 250c of each organic light emitting diode for the connection.

That is, the second electrodes 250c of the organic light emitting diodes may be connected to the conductive patterns 260 at the cathode contacts. To this end, an upper side of a part of each conductive pattern 260 may be exposed from the contact region by removing the pixel defined layer 270.

The bus region may include the bus lines 230 connected to the second electrodes 250c of the organic light emitting diodes via the conductive patterns 260. That is, the bus lines 230 may be configured to deliver the low potential pixel power ELVSS to the second electrodes 250c of the organic light emitting diodes. The bus lines 230 may contact and connect to the conductive patterns 260 on the bus unit.

The bus lines 230 may be formed on the same layer, and made of the same material as any one of the gate electrode, the source electrode, and drain electrode of the thin film transistors 220 and 220'.

For example, as illustrated in FIG. 3, the bus lines 230 may be formed on the same layer and made of the same material as the source and drain electrodes of the thin film transistors 220 and 220'.

Alternatively, the bus lines 230 may be formed on the same layer and made of the same material as the gate electrodes of the thin film transistors 220 and 220'. Alternatively, the bus lines 230 may have a structure in which at least two wires positioned on different layers are connected to each other.

The sealing unit may be a region in which the sealing agent 280 is disposed at the outside of the bus unit. The sealing agent 280 may be configured to bond the first and second substrates 200 and 300.

Alternatively, the sealing unit may partially overlap the bus unit. That is, the sealing agent 280 may be positioned on an upper side of at least a part of the bus lines 230. An insulation layer such as the first overcoat 240a may be disposed between the sealing agent 280 and the bus lines 230.

According to the above-mentioned embodiments, the pixel unit, the built-in-circuit and the cathode contacts, the bus unit, and the sealing unit may be sequentially disposed in the direction from the central region to the outer side. Accordingly, dead space may be reduced without reducing a width of the bus lines 230 configured to deliver the low potential pixel power.

In detail, in comparison to a comparative example in which the bus unit is disposed between the pixel unit and the built-in-circuit, the region of the bus unit and/or the built-in-circuit must be reduced in order to reduce dead space in the comparative example. However, in the embodiments, the bus unit is disposed outside the built-in-circuit. Accordingly, the bus unit may be partially overlapped with the sealing unit.

Since the built-in-circuit is weak against heat and static electricity ESD generated during the sealing process, the built-in-circuit adjacent to the sealing unit cannot be overlapped with the sealing agent 280. Consequently, a design space which can be utilized is restricted. Also, the built-in-circuit need to be disposed close to the outside of the display panel, and thus, it is likely to be damaged by static electricity.

However, according to arrangement such as the embodiments, the built-in-circuit is positioned in a region inside the bus unit, the built-in-circuit may be prevented from being damaged by static electricity. Also, inferior driving function may not occur even when the bus lines 230 are partially overlapped with the sealing agent 280. Accordingly, dead space may be reduced, and a sufficient width of the bus lines 230 can be secured. Because of these features, it is possible to prevent IR drop of the low potential pixel power ELVSS delivered through the bus lines 230.

In addition, the built-in-circuit is not overlapped with the bus unit. Therefore, material of an electrode such as a gate electrode 220a', and source and drain electrodes 220c' and 220d' that form the thin film transistor 220' of the built-in-circuit may be used to freely design the bus lines 230 in a single layer or multiple layers. Accordingly, low resistance design of the bus lines 230 may be realized, and therefore, the low potential pixel power ELVSS may be more effectively prevented.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light emitting display device, comprising:
a pixel unit comprising a plurality of pixels, each of the pixels including an organic light emitting diode having a first electrode, a second electrode, and an organic light emitting layer;
a built-in-circuit comprising a driving circuit configured to drive the pixels;
a bus unit comprising bus lines configured to deliver pixel power to the pixels; and
a sealing unit that includes a sealing agent, wherein:
the pixel unit, the built-in-circuit, and the bus unit are sequentially disposed from a central region of a display panel to an outer side of the display panel,
the second electrode of the organic light emitting diode and one of the bus lines are electrically connected to each other through one of conductive patterns formed on at least a part of the built-in-circuit and at least a part of the bus unit, the one of conductive patterns contacting the one of the bus lines in a contact region within the bus unit, and
the sealing agent partially overlaps the bus lines, and the sealing agent is in a non-overlapping relationship with the built-in-circuit and the contact region within the bus unit.

2. The organic light emitting display device as claimed in claim 1, wherein at least a part of the second electrode of the organic light emitting diode is formed on the each whole pixel in the pixel unit.

3. The organic light emitting display device as claimed in claim 2, wherein the second electrode of the organic light emitting diode is a cathode electrode, and each of the bus lines delivers low potential pixel power to the cathode electrode.

4. The organic light emitting display device as claimed in claim 1, wherein the conductive patterns are formed on the same layer as the first electrode of the organic light emitting diode, and are made of the same material as the first electrode of the organic light emitting diode.

5. The organic light emitting display device as claimed in claim 4, wherein the first electrode of the organic light emitting diode is an anode electrode, and the conductive patterns are made of the same material as the anode electrode.

6. The organic light emitting display device as claimed in claim 1, wherein the second electrode of the organic light emitting diode is connected to one of the conductive patterns on the built-in-circuit, and the bus lines are connected to the conductive patterns on the bus unit.

7. The organic light emitting display device as claimed in claim 1, wherein each of the pixels further includes a first thin film transistor electrically connected to the organic light emitting diode,
wherein the bus lines are formed on the same layer as any one of a gate electrode, source electrode, and drain electrode of the first thin film transistor, and are made of the same material as any one of the gate electrode, the source electrode and the drain electrode of the first thin film transistor.

8. The organic light emitting display device as claimed in claim 7,
wherein the built-in-circuit further comprises a second thin film transistor electrically connected to the organic light emitting diode, and
wherein the bus lines are formed on the same layer as the source and drain electrodes of the second thin film transistor, and are made of the same material as the source and drain electrodes of the second thin film transistor.

9. The organic light emitting display device as claimed in claim 1, further comprising cathode contacts, each of the cathode contacts including a contact region in which one of the conductive patterns is connected to the second electrode of the organic light emitting diode,
wherein the cathode contacts are disposed so as to overlap the built-in-circuit.

10. The organic light emitting display device as claimed in claim 1, wherein:
the sealing agent is configured to seal a region including the pixel unit, and
the sealing unit is disposed so as to partially overlap the bus unit.

11. The organic light emitting display device as claimed in claim 1, wherein the built-in-circuit includes either of a scan driving unit and a light emitting control driving unit, or both of the scan driving unit and the light emitting control driving unit.

12. The organic light emitting display device as claimed in claim 11, wherein the built-in-circuit is formed on both sides of the pixel unit, and both sides of the pixel unit face each other.

13. The organic light emitting display device as claimed in claim 1, wherein the built-in-circuit is in a non-overlapping relationship with the sealing unit, and the sealing unit partially overlaps the bus unit.

14. The organic light emitting display device as claimed in claim 13, wherein the built-in-circuit is in a non-overlapping relationship with the bus unit.

15. The organic light emitting display device as claimed in claim 14, wherein the sealing agent partially overlaps the bus lines in a width direction, the width direction being defined as a direction extending from the central region to the outer side of the display panel.

16. The organic light emitting display device as claimed in claim 1, wherein the bus lines extend between the bus unit and the sealing unit along a width direction, and the sealing agent overlaps portions of the bus lines in the sealing unit along the width direction such that other portions of the bus lines along the width direction are in a non-overlapping relationship with the sealing agent.

* * * * *